(12) United States Patent
Itahashi

(10) Patent No.: US 8,962,372 B2
(45) Date of Patent: Feb. 24, 2015

(54) PHOTOELECTRIC CONVERSION DEVICE AND FABRICATION METHOD THEREFOR

(71) Applicant: Canon Kabushiki Kaisha, Tokyo (JP)

(72) Inventor: Masatsugu Itahashi, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/224,755

(22) Filed: Mar. 25, 2014

(65) Prior Publication Data

US 2014/0203171 A1    Jul. 24, 2014

Related U.S. Application Data

(60) Division of application No. 13/974,379, filed on Aug. 23, 2013, now Pat. No. 8,716,055, which is a continuation of application No. 13/190,921, filed on Jul. 26, 2011, now Pat. No. 8,546,173, which is a division of application No. 12/065,301, filed as application No. PCT/JP2006/319226 on Sep. 21, 2006, now Pat. No. 8,013,409.

(30) Foreign Application Priority Data

Sep. 27, 2005  (JP) ................. 2005-280108
Sep. 27, 2005  (JP) ................. 2005-280109

(51) Int. Cl.
*H01L 21/00*       (2006.01)
*H01L 27/146*      (2006.01)
*H01L 31/0232*     (2014.01)
*H01L 31/18*       (2006.01)

(52) U.S. Cl.
CPC .... *H01L 27/14625* (2013.01); *H01L 27/14629* (2013.01); *H01L 27/14685* (2013.01); *H01L 31/0232* (2013.01); *H01L 31/18* (2013.01); *H01L 27/14621* (2013.01); *H01L 27/14623* (2013.01); *H01L 27/14627* (2013.01)
USPC ............................. 438/69; 438/70

(58) Field of Classification Search
CPC ................. H01L 27/14629; H01L 27/14685; H01L 31/0232; H01L 31/18; H01L 27/14625; H01L 27/14621; H01L 27/14623; H01L 27/14627
USPC ......................... 438/48, 65, 69, 70
See application file for complete search history.

(56) References Cited

U.S. PATENT DOCUMENTS 6,166,369 A    12/2000   Assadi et al.
6,514,785 B1    2/2003   Chiang et al.

(Continued)

FOREIGN PATENT DOCUMENTS

| | | |
|---|---|---|
| JP | 2000-150845 | 5/2000 |
| JP | 2001-111873 | 4/2001 |
| JP | 2002-530896 | 9/2002 |
| JP | 2002-359363 | 12/2002 |
| JP | 2003-060179 | 2/2003 |
| JP | 2004-193500 | 7/2004 |
| JP | 2005-109411 | 4/2005 |
| JP | 2005-209962 | 8/2005 |
| WO | 00/31805 | 6/2000 |

*Primary Examiner* — Hung Vu
(74) *Attorney, Agent, or Firm* — Fitzpatrick, Cella, Harper & Scinto

(57) ABSTRACT

A photoelectric conversion device comprises a high-refractive-index portion at a position close to a photoelectric conversion element therein. And, the high-refractive-index portion has first and second horizontal cross-section surfaces. The first cross-section surface is at a position closer to the photoelectric conversion element rather than the second cross-section surface, and is larger than an area of the second cross-section surface, so as to guide an incident light into the photoelectric conversion element without reflection.

20 Claims, 15 Drawing Sheets

(56) References Cited

U.S. PATENT DOCUMENTS

| | | | |
|---|---|---|---|
| 6,916,680 B2 * | 7/2005 | Lee et al. | 438/70 |
| 7,064,405 B2 | 6/2006 | Kondo et al. | |
| 7,135,666 B2 | 11/2006 | Dobashi | |
| 7,956,432 B2 | 6/2011 | Zheng et al. | |
| 2005/0116269 A1 | 6/2005 | Yokozawa | |
| 2005/0236553 A1 * | 10/2005 | Noto et al. | 250/208.1 |
| 2006/0076636 A1 | 4/2006 | Fukunaga | |
| 2006/0115230 A1 | 6/2006 | Komoguchi et al. | |
| 2008/0029793 A1 | 2/2008 | Watanabe et al. | |
| 2009/0250779 A1 * | 10/2009 | Hirose et al. | 257/432 |

* cited by examiner

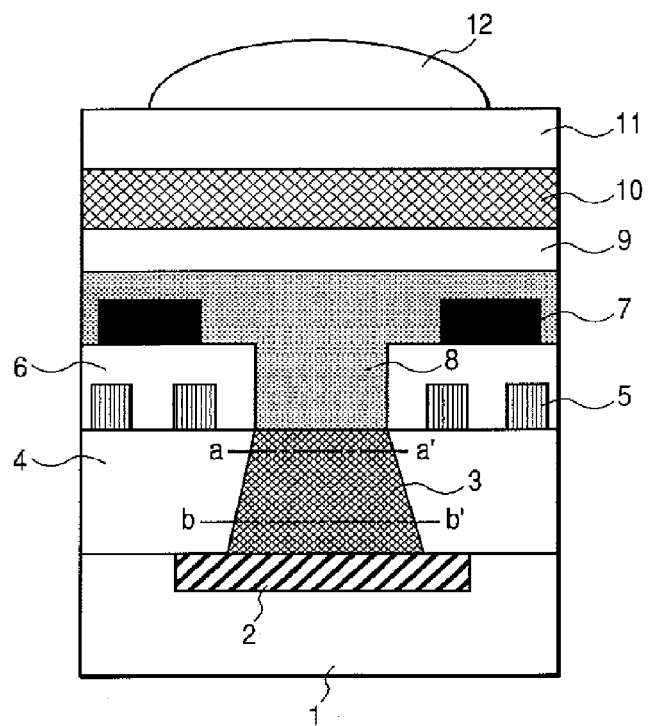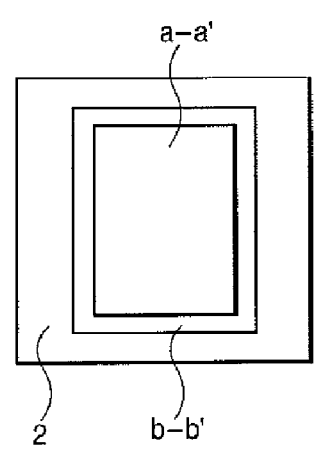

PHOTOELECTRIC CONVERSION DEVICE AND FABRICATION METHOD THEREFOR

CROSS REFERENCE TO RELATED APPLICATION

This application is division of application Ser. No. 13/974,379 filed Aug. 23, 2013, which is a continuation of U.S. application Ser. No. 13/190,921 (now U.S. Pat. No. 8,546,173), which is a division of Ser. No. 12/065,301 (now U.S. Pat. No. 8,013,409), which is a 371 of international PCT/JP2006/319226 filed Sep. 21, 2006. The entire disclosures of these earlier applications are hereby incorporated herein by reference.

TECHNICAL FIELD

The present invention relates to a photoelectric conversion device and a fabrication method therefor, and particularly to a condensing portion of the photoelectric conversion device.

BACKGROUND ART

In the case of a photoelectric conversion device used for a digital camera and camcorder, a pixel is miniaturized through decrease of the device in size and change of the device to multiple pixels. In connection with miniaturization of the pixel, the area of the light receiving portion of the photoelectric conversion element is decreased and incident light quantity is decreased, thereby the sensitivity is deteriorated.

To improve deterioration of the sensitivity, deterioration of the sensitivity is reduced by forming an on-chip microlens on the light receiving portion of the photoelectric conversion device and condensing light to the light receiving portion. Moreover, in recent years, a configuration is known in which an optical waveguide for condensing light by using light reflection is formed between an on-chip microlens and a photoelectric conversion element.

A method for fabricating an optical waveguide of the above photoelectric conversion device has a step of filling a well-shaped portion after a step of forming a well-shaped portion on an insulating layer in general. A material for embedding uses a material having a high refractive index compared to that of the insulating layer. Then, light is reflected from interfaces due to the refractive index difference between the insulating layer and the high refractive index portion and condensed.

However, as pixels are further miniaturized, the aspect ratio of a well-shaped portion becomes high and a void may be produced in the well-shaped portion in an embedding step. Particularly, this problem easily occurs in a CMOS image sensor having multilayer wiring.

Therefore, there is the following technique to solve the problem in the embedding step. Japanese Patent Application Laid-Open No. 2004-193500 discloses a method for forming an optical waveguide by dividing it into a plurality of layers having different diameters.

By forming an optical waveguide constituted of a plurality of layers for each layer, it is possible to preferably fill a high refractive index portion without producing a void. Specifically, by repeating a step of filling the inside of a well-shaped portion after a step of forming a well-shaped portion, an optical waveguide free from void is formed.

Moreover, in the case of a structure having a plurality of optical waveguides, the diameter of an optical waveguide at the light incoming side. Thereby, filling of the inside and introduction of light are made easy.

Furthermore, in Japanese Patent Application Laid-Open No. 2000-150845, it is described to form an etching stop film in order to make the depth of a well-shaped structure constant when forming a well-shaped portion.

Furthermore, Japanese Patent Application Laid-Open No. 2002-359363 discloses a structure having a light guide layer in a CCD-type photoelectric conversion device. That is, a light transmission film is formed and then, the side wall of the light transmission film is surrounded by a reflection film. The shape of the light transmission film is tapered toward a light receiving portion.

However, in the case of a structure having a plurality of optical waveguides, when light is reflected at an upper-layer optical waveguide and enters a lower-layer optical waveguide, a case of not satisfying a reflection condition occurs. Then, the light not entering the photoelectric conversion element becomes color mixture or noise component.

Moreover, when bringing a lower-layer optical waveguide into a vertical shape in a structure having a plurality of optical waveguides, light not satisfying a reflection condition depending on an incident angle may be present even for the light not reflecting from the interface of an upper-layer optical waveguide but directly entering the interface of a lower-layer optical waveguide.

Moreover, in the case of a light guide layer of a CCD-type photoelectric conversion device described in Japanese Patent Application Laid-Open No. 2002-359363, incident light quantity may be decreased because the area at the light incoming side of a light transmission film is decreased. Furthermore, light may be reflected by the light shielding film of a transfer electrode instead of entering a photoelectric conversion element.

DISCLOSURE OF THE INVENTION

A photoelectric conversion device comprises:

a semiconductor substrate;

a photoelectric conversion element arranged in the semiconductor substrate;

a plurality of MOS transistors each having a gate electrode for reading electric charge from the photoelectric conversion element;

a plurality of insulating layers arranged at a position higher than the gate electrode;

a multilayer structure having patterned layers arranged at a portion higher than the gate electrode; and a plurality of high-refractive-index portions each having refractive index higher than that of the insulating layer so as to guide light into the photoelectric conversion element by the reflection at an interface between the insulating layer and the high-refractive-index portion.

The high-refractive-index portion at a position closest to the photoelectric conversion element among the high-refractive-index portions has, a first cross-section surface and a second cross-section surface horizontal to a light receiving surface of the photoelectric conversion element at a position closer to the photoelectric conversion element rather than the patterned layer at a position closest to the photoelectric conversion element among the patterned layers, and the area of the first cross-section surface at a position closer to the photoelectric conversion element rather than the second cross-section surface is larger than the area of the second cross-section surface.

Other features and advantages of the present invention will be apparent from the following description taken in conjunc-

BRIEF DESCRIPTION OF THE DRAWINGS

FIG. 2A is a sectional view of the photoelectric conversion device of the first embodiment of the present invention;

FIG. 2B is a sectional projection view of an optical waveguide of the photoelectric conversion device of the first embodiment of the present invention;

Figure 1:
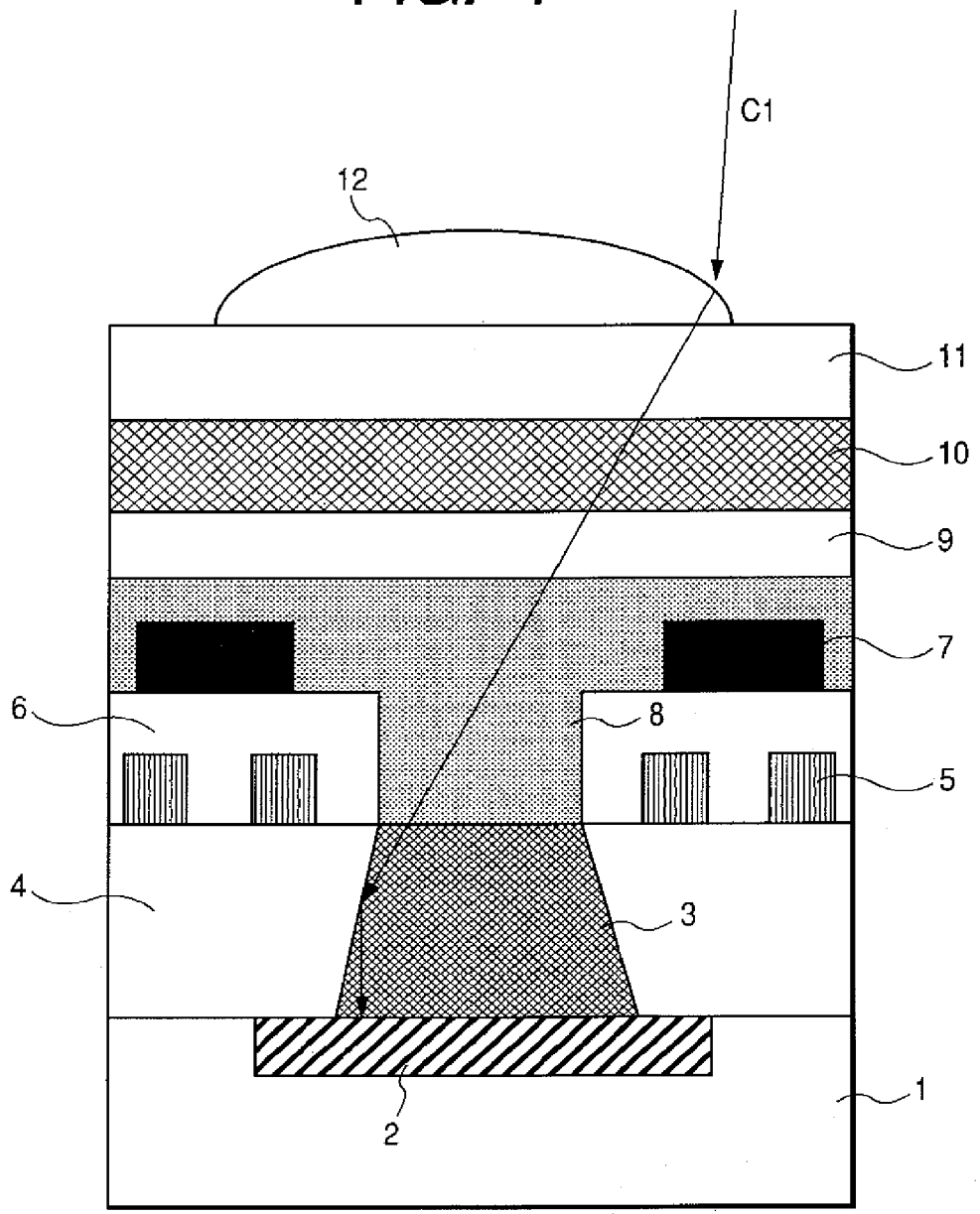
FIG. 1 is a sectional view of a photoelectric conversion device of first embodiment.

The accompanying drawings, which are incorporated in and constitute a part of the specification, illustrate embodiments of the invention and, together with the description, serve to explain the principles of the invention.

BEST MODE FOR CARRYING OUT THE INVENTION

In the case of a photoelectric conversion device of the present invention, a plurality of stacked optical waveguides using the refractive index difference of the interface between an insulating layer and high refractive index portion having a refractive index higher than that of the insulating layer are formed. The high refractive index portion has at least a first high refractive index portion formed at a position closest to the photoelectric conversion element and a second high refractive index portion formed above the first high refractive index portion. The first high refractive index portion is formed at a position closer to the photoelectric conversion element than a patterned layer formed at a position closest to the photoelectric conversion element. Moreover, in the first high refractive index portion, the area on a face closer to the photoelectric conversion element is larger than the area of a face horizontal to the light receiving surface of the photoelectric conversion element.

In this case, the high refractive index portion is formed on a semiconductor substrate correspondingly to the photoelectric conversion element and the area and the element have a refractive index higher than that of an insulating layer constituting an optical waveguide. Specifically, they are formed of silicon nitride or oxynitriding silicon. Moreover, the insulting layer is formed of a material having a refractive index lower than that of the layer. For example, the layer is formed of silicon oxide. Moreover, the high-refractive-index layer shows a layer for forming a high refractive index portion.

By forming the shape of a high refractive index portion closest to a photoelectric conversion element into the shape of the present invention, the area becomes a configuration for easily satisfying the reflection condition of an optical waveguide and it makes possible to effectively bring light into the photoelectric conversion element.

By setting the first high refractive index portion having the shape of the present invention to a position closer to the photoelectric conversion element than a patterned layer formed on a position closest to the photoelectric conversion element, the design versatility of the patterned layer is improved. It is possible to narrow the interval between patterns in accordance with miniaturization of pixels. Moreover, in the case of a photoelectric conversion device having a plurality of patterned layers, by forming a second high refractive index portion, it is possible to make oblique ray enter the photoelectric conversion element. Therefore, it is possible to narrow the interval between patterned layers to be arranged at a position coslet to the photoelectric conversion element without deteriorating condensing efficiency of the photoelectric conversion element.

In this case, the patterned layer is a wiring layer or light shielding layer and is constituted of a conductive material such as aluminum or copper. Moreover, a gate electrode made of polysilicon is excluded. It is allowed that a patterned layer formed at a position closest to a photoelectric conversion element is a patterned layer for specifying the opening of the photoelectric conversion element. The pattern for specifying the opening of the photoelectric conversion element is used to decide the margin of a region entering the photoelectric conversion element. In this case, a pattern which decides the opening is known by performing optical simulation of an element cross section.

Moreover, it is recommended to form the second high refractive index portion to be formed above the first high refractive index portion to the following shape. That is, the area of the second plane at the photoelectric conversion element is decreased compared to the first cross-section surface in which the second high refractive index portion is present. Even if a patterned layer formed at a position closest to the photoelectric conversion element specifies the opening, it is possible to effectively condense light by increasing the effective opening area of the photoelectric conversion element while narrowing the interval between patterns of the patterned layer. Particularly, this is very effective when setting an optical waveguide constituted of the high refractive index portion of the shape to the highest position.

Moreover, it is recommended to make the size of the surface area of the photoelectric conversion element of a high refractive index portion formed at a position closest to a photoelectric conversion element smaller than the surface area of the photoelectric conversion element. In this case, it is possible to decrease the leak of light to portions other than the photoelectric conversion element and this is particularly effective when considering a shift during fabrication.

It is a matter of course that the position of an optical waveguide or the number of optical waveguides is properly optimally designed.

For example, it is preferable that the high refractive index portion has a thickness between 200 and 2,000 nm in the film thickness direction. More preferably, the area has a thickness of 500 nm or more. It is possible to decrease the damage on a photoelectric conversion element by virtue of the high refractive index portion when there is an etching step after forming the area.

Moreover, it is allowed that the high refractive index portion also has the function of an etching stop layer. Furthermore, since the area has the thickness of this range, it is possible to effectively use the function of an optical waveguide using reflection on the interface between the high refractive index portion and the insulating layer. This is described below.

Figure 6:
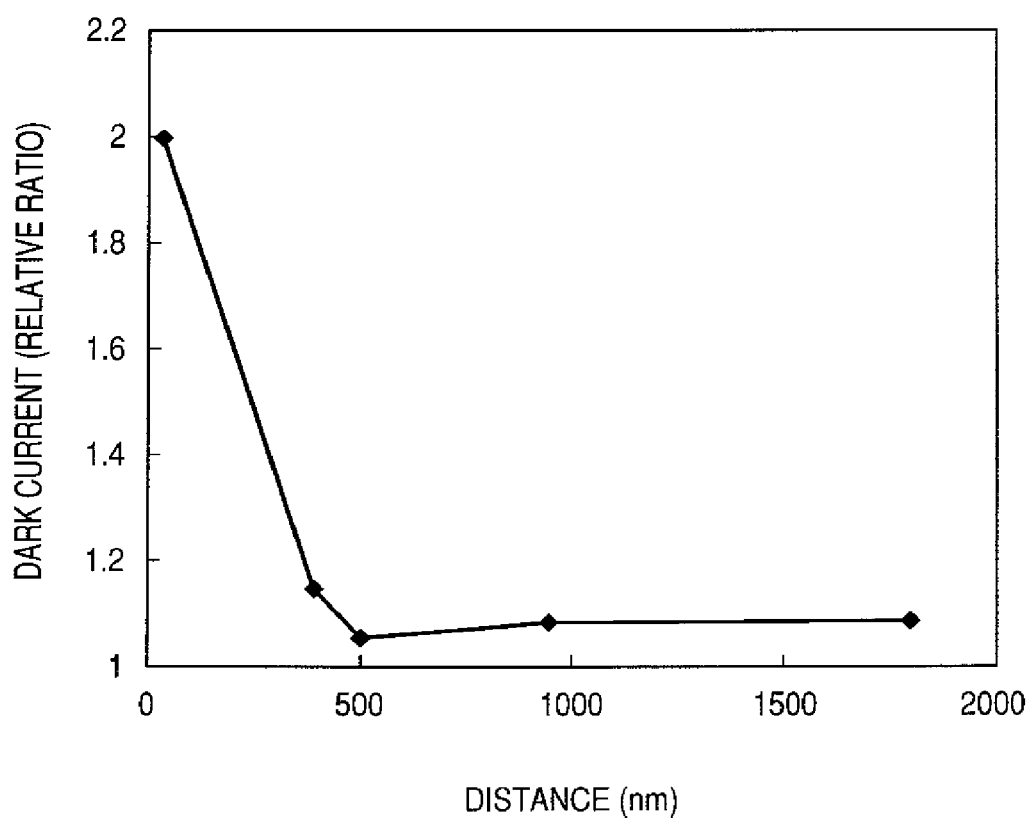
FIG. 6 is an illustration showing a relation between a film thickness and a dark current.

In this case, FIG. 6 shows the relation between the distance from the light receiving surface of a photoelectric conversion element to the bottom of a well-shaped portion and dark current when applying well-shaped portion to a photoelectric conversion device. This well-shaped portion forms in the insulating layer formed at a position closest to a photoelectric conversion element by plasma etching. In this case, the photoelectric conversion device uses a photoelectric conversion device after forming a well-shaped portion before forming a high refractive index portion. Moreover, the dark current is shown by a relative ratio by assuming a current which does not form a well-shaped portion as 1.

From this graph, it is found that dark current increases as the distance from the light receiving surface of a photoelectric conversion element to the bottom of the well-shaped portion is decreased. And the dark current is decreased at 500 nm or more. Therefore, it is possible to decrease the number of damage at the time of plasma etching when the thickness of a high refractive index portion formed on a photoelectric conversion element is 500 nm or more.

Moreover, an LDD (Lightly Doped Drain) structure may be used for a field-effect transistor included in a photoelectric conversion device to reduce dark current by electric field concentration nearby a drain diffusion region. In the case of the LDD structure, a side wall is formed on the gate electrode of the transistor (not illustrated).

When the LDD structure is used, it is possible to form a side wall by using the high-refractive-index layer for forming the previous high refractive index portion. As a specific step, after forming the gate electrode of a transistor, a high-refractive-index layer is formed by covering the gate electrode. Then, by anisotropically etching the high-refractive-index layer, it is possible to form a high refractive index portion and side wall at the same time. Moreover, by forming them in this step, it is possible to decrease man-hours and protect a photoelectric conversion element from the etching when forming a side wall. It is a matter of course that even when performing etchings in separate steps, it is possible to decrease the number of man hours because of using the same high-refractive-index layer.

In this case, when increasing the thickness of the high-refractive-index layer for protection from etching damages, it may be impossible to form a side wall through etching. Also, it may be impossible to form it because the thickness of the layer is insufficient even when decreasing the side wall in thickness. The preferable thickness is the thickness equivalent to the thickness of a gate electrode, for example, 200 nm.

From FIG. 6, it is found that the number of damage on a photoelectric conversion element in an etching step can be decreased even in this thickness.

In the case of any structure, it is possible to effectively use the function of an optical waveguide using the reflection on the interface between the high refractive index portion having the thickness and the insulating layer.

Hereafter, the "cross-section surface" of a high refractive index portion shows a cross section in the direction horizontal to the light receiving surface of the photoelectric conversion element of the high refractive index portion. Moreover, it is assumed that a certain plane of a high refractive index portion is a first cross-section surface and a plane closer to the photoelectric conversion element than the first cross-section surface is a second plane.

In this case, the "on semiconductor substrate" shows "on the main surface of a semiconductor substrate" on which pixels are formed. Moreover, it is assumed that the direction from the main surface of the semiconductor substrate to the inside of the substrate is downward direction and the reverse direction is upward direction.

Furthermore, a semiconductor substrate serving as a material substrate is shown as "substrate". However, the following case in which the material substrate is treated is also included. For example, a member on which one or more semiconductor regions are formed, member present at the middle of a series of fabrication steps or member passing through a series of fabrication steps can be referred to as a substrate.

(Circuit Configuration of Pixel)

Figure 15:
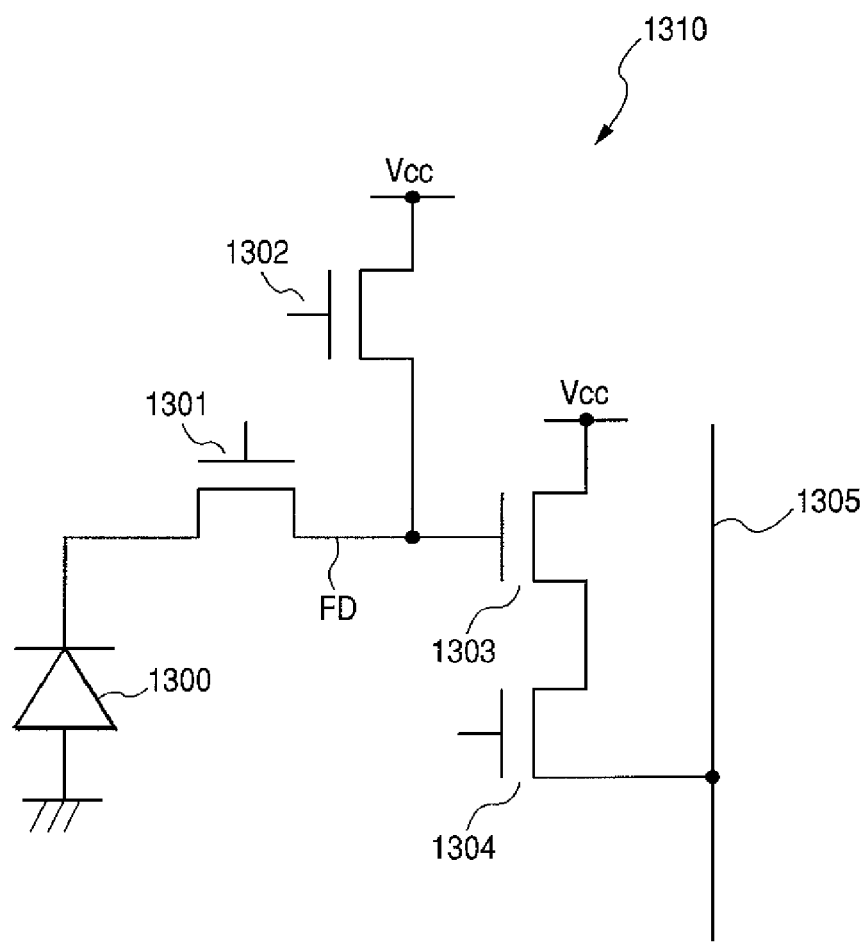
FIG. 15 is an equivalent circuit of pixels of a photoelectric conversion device of the present invention.

FIG. 15 shows a circuit configuration of pixels in a CMOS-type photoelectric conversion device which is a type of a photoelectric conversion device. Pixels are shown by 1310.

The pixel 1310 is constituted by including a photodiode 1300 serving as a photoelectric conversion element, transfer transistor 1301, reset transistor 1302, amplifying transistor 1303 and selection transistor 1304. In this case, a power supply line is shown by Vcc and an output line is shown by 1305.

In the photodiode 1300, the anode is connected to a ground line and the cathode is connected to the source of the transfer transistor 1301. Moreover, the source of the transfer transistor can also serve as the cathode of the photodiode.

The drain of the transfer transistor 1301 constitutes floating diffusion (hereafter referred to as FD) serving as a transfer region, and the gate of it is connected to a transfer signal line. In the reset transistor 1302, the drain is connected to the power supply line Vcc, the source constitutes the FD and the gate is connected to a reset signal line.

In the amplifying transistor 1303, the drain is connected to the power supply line Vcc, the source is connected to the drain of the selection transistor 1304 and the gate is connected to the FD. In the selection transistor 1304, the drain is connected to the source of the amplifying transistor 1303, the source is connected to the output line 1305 and the gate is connected to a vertical selection line to be driven by a vertical selection circuit (not illustrated).

The circuit configuration shown above can be applied to all embodiments of the present invention. For example, the circuit configuration can be applied to a circuit configuration having no transfer transistor or other circuit configuration sharing a transistor by a plurality of pixels. Moreover, a photoelectric conversion element can be applied to not only a photodiode but also a phototransistor.

Embodiments of the present invention are described in detail by referring to the accompanying drawings.

First Embodiment

FIG. 1 shows a sectional schematic view of the photoelectric conversion device of this embodiment in the direction vertical to a semiconductor substrate. FIG. 1 shows one pixel of the previously described CMOS-type photoelectric conversion device. In the case of an actual photoelectric conversion device, a plurality of pixels like the above pixel are formed on a semiconductor substrate.

In the case of this embodiment, an optical waveguide structure constituted of two optical waveguides is formed on one pixel of a photoelectric conversion device. In this case, the second cross-section surface of a first high refractive index portion 3 constituting an optical waveguide nearby a photoelectric conversion element 2 is formed at a size larger than the area of a first cross-section surface.

FIG. 1 is described below in detail.

The first high refractive index portion 3 is formed on a semiconductor substrate 1 and covered with an insulating layer 4. Moreover, a first pattern 5 and insulating layer 6 for covering the first pattern 5 are formed on the insulating layer 4 and a second pattern 7 is formed on the insulating layer 6.

A second high refractive index portion 8 is formed above the first high refractive index portion 3. Then, a planarized layer 9, color filter layer 10, planarized layer 11 and on-chip microlens 12 formed on the planarized layer 11 are provided above the second high refractive index portion 8.

The first high refractive index portion 3 is formed on the photoelectric conversion element 2. The first high refractive index portion 3 is made of a transparent material passing light and has a refractive index higher than the insulating layer 4 present around the area 3. It is preferable to use a plasma SiN film, plasma SiON film, resist or titanium oxide as the material of the first high refractive index portion 3 satisfying the above condition. Moreover, the second plane of the first high refractive index portion 3 has a tapered shape having an area larger than the first cross-section surface.

It is preferable that the first high refractive index portion 3 has a thickness of 500 nm or more as previously described. Moreover, it is preferable that the upper limit of the thickness is equal to the bottom side or the upper plane of the first pattern 5. Specifically, the upper limit is approx. 2,000 nm. This is because the first pattern 5 is easily formed like the case to the planarization step. It is possible to decrease the damage on photoelectric conversion element due to etching when forming the second high refractive index portion 8 shown in FIG. 1.

Moreover, in this case, when forming the LDD structure of a transistor, it is preferable that the first high refractive index portion 3 has a thickness equal to a gate electrode and film thickness direction, for example, a thickness of approx. 200 nm. By using the thickness, it is possible to simultaneously form the side wall of the LDD structure and first high refractive index portion 3 and decrease the number of man hours in addition to reduction of the number of damage on the photoelectric conversion element 2. It is a matter of course that the number of man hours can be decreased because the same high-refractive-index film is used even when performing each etching in another step. Moreover, it is possible to decrease the damage on a photoelectric conversion element in the etching step even for this thickness from FIG. 6.

In the case of any structure, it is possible to effectively use the function of an optical waveguide using the reflection on the interface between a high refractive index portion having the above thickness and an insulating layer.

It is possible to use silicon oxide or silicon oxide doped with phosphorus, boron or fluorine as the material of the insulating layer 4 covering the photoelectric conversion element 2 and first high refractive index portion 3. It is also allowed that, for example, a gate insulating film and gate electrode are present between the semiconductor substrate 1 and the insulating layer 4 though not illustrated.

In this case, "cross-section surface" is described by referring to FIGS. 2A and 2B.

FIG. 2A shows the position of a cross-section surface horizontal to the light receiving surface of the photoelectric conversion element 2 in the high-refractive-index portion. FIG. 2B is an illustrations obtained by projecting the cross-section surface of the first high refractive index portion 3 at the lines a-a' and b-b' in FIG. 2A. Moreover, in this case, symbol 2 in FIG. 2B shows the surface shape of the photoelectric conversion element 2 in FIG. 2A.

In this case, the cross-section surface at the line a-a' is a first cross-section surface of the first high-refractive-index portion 3. The cross-section surface at the line b-b' is a second cross-section surface formed at a position closer to the photoelectric conversion element than the first cross-section surface. It is allowed that position and distance of these lines are changed when relative vertical relations are equal.

As previously described, in FIG. 2B, the area of the second cross-section surface b-b' of the first high-refractive-index portion 3 is larger than the area of the first cross-section surface a-a'.

Moreover, in this case, it is preferable that the area of a cross-section surface at the lowest position of the first high-refractive-index portion 3 is smaller than the surface area of the photoelectric conversion element 2. That is, it is preferable that the area of a cross-section surface facing the light receiving surface of the photoelectric conversion element 2 of a high-refractive-index portion for forming an optical waveguide formed at a position closest to the photoelectric conversion element 2 is smaller than the surface area of the photoelectric conversion element 2. Thereby, it is possible to decrease the leak of light to a portion other than the photoelectric conversion element 2 and particularly, decrease of the leak of light is effective when considering a shift during fabrication.

Then, the first pattern 5 is formed of a conductive material such as aluminum or copper. Moreover, the insulating layer 6 is formed of an insulator, for example, silicon oxide.

The second pattern 7 is constituted of a conductive material such as aluminum or copper and may be formed as a light shielding film for light-shielding the photoelectric conversion element 2 in addition to wiring.

The second high-refractive-index portion 8 is formed directly on the photoelectric conversion element 2 and contacts with the first high-refractive-index portion 3. The second high-refractive-index portion 8 is made of a transparent material for passing light and has a refractive index higher than that of the insulating layer 6. As the material satisfying the above condition, it is preferable to use a plasma SiN film, plasma SiON film, resist or titanium oxide. Moreover, it is allowed that the second high-refractive-index portion 8 serves as a passivation layer covering the second pattern 7.

Because the second high-refractive-index portion 8 contacts with the first high-refractive-index portion 3, light is not scattered and it is possible to condense light to the photoelectric conversion element 2. In this case, it is more preferable that the second high refractive index portion 8 is made of a material having the same refractive index as that of the first high refractive index portion 3. This is because reflections on these interfaces are able to be decreased. However, it is also allowed that the same refractive index is not used. It is allowed to form an antireflection film on these interfaces in order to decrease reflections on the interfaces.

The planarized layer 9 is formed above the second high refractive index portion 8 in accordance with necessity. Similarly, the color filter layer 10 is also formed above the planarized layer 9 according to necessity. The arrangement is a Beyer arrangement using three colors of red, green and blue, for example. Moreover, the planarized layer 11 is formed above the color filter layer 10 according to necessity. The on-chip microlens 12 is set above the planarized layer 11 to play a role for effectively taking in light into each pixel.

In this case, the relation between the refractive index of a material for forming an optical waveguide and the incident angle of light is shown below.

It is assumed that the refractive index of a high refractive index portion in an optical waveguide is n1 and the refractive index of an insulating layer at the outside of the area is n2. Then, when assuming that the incident angle of the light incoming to the interface between the high refractive index portion of an optical waveguide and an insulating layer as θ a range for satisfying total reflection is θ>arcsin(n2/n1). In this case, the critical angle for total reflection is assumed as θc=arcsin(n2/n1).

Figure 3A:
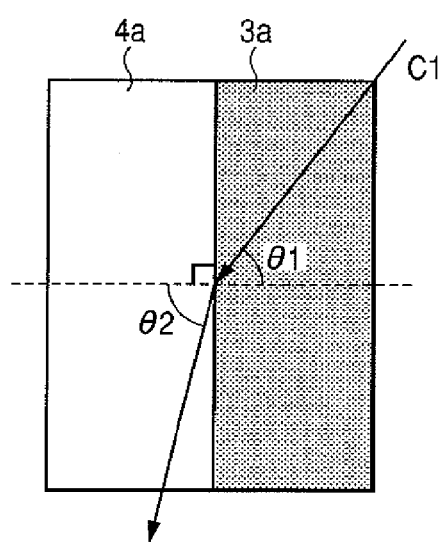
FIG. 3A is a sectional view of a part of an optical waveguide.
Figure 3B:
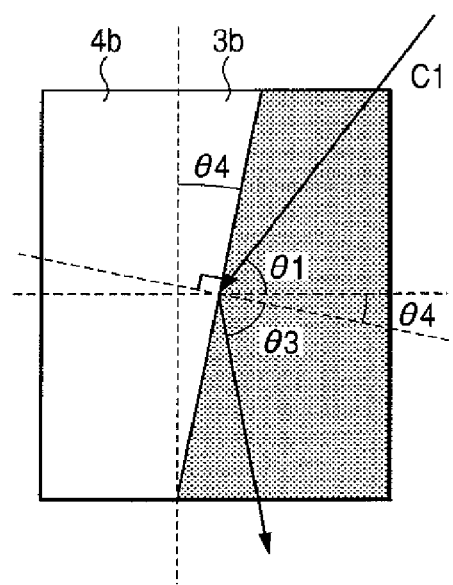
FIG. 3B is a sectional view of a part of an optical waveguide.

FIGS. 3A and 3B show vertical cross-section surfaces to the light receiving surface of the photoelectric conversion element 2 at an optical waveguide portion.

First, a case is considered in which the interface between the high refractive index portion of an optical waveguide and an insulating layer is vertical to the light receiving surface of a photoelectric conversion element as shown in FIG. 3A.

The range in which the incident light C1 of an incident angle θ1 total-reflects is θc<θ1<90°. However, when θ1 is smaller than θc, the incident light C1 is refracted without satisfying the total reflection condition on the interface between 3a and 4a. The refractive angle θ2 in this case becomes θ2=arcsin(sin θ1*n1/n2). As a result, the incident light C1 does not contribute to photoelectric conversion but it becomes color mixture or noise.

The first high refractive index portion 3 of this embodiment is formed so that the area of the second plane becomes larger than the area of the first cross-section surface. That is, as shown in FIG. 3B, the first high refractive index portion 3 tilts toward the light receiving surface of the photoelectric conversion element at an angle of θ4.

When the incident light C1 enters FIG. 3B similarly to the case of FIG. 3A, the incident angle for the interface between the high refractive index portion of an optical waveguide and an insulating layer becomes θ1+θ4. The incident angle of the incident light C1 satisfying the total reflection condition is θc<θ1+θ4<90°. In this case, because the tilt angle θ4 is fixed, the range of the angle θ1 formed with the above semiconductor substrate to be changed by light becomes θc−θ4<θ1<90°−4.

That is, in the case of the optical-waveguide shape shown in FIG. 3B, total reflection is realized also when the incident light C1 more obliquely enters compared to the shape in FIG. 3A. Therefore, by including the structure shown for this embodiment, it is possible to make the incident light present in the above angular region efficiently enter a photoelectric conversion element.

A fabrication method for forming the optical waveguide having the above shape is the same as the fabrication method to be described in detail for a subsequent embodiment.

In this case, as previously described, it is preferable that the high refractive index portion is present between 200 and 2,000 nm in the film thickness direction. More preferably, the area has a thickness of 500 nm or more. It is possible to decrease the number of damage on a photoelectric conversion element when forming the second high refractive index portion and a pattern is easily formed.

In FIG. 1 showing this embodiment, the highest portion of the first high refractive index portion 3 and the lowest portion of the second high refractive index portion 8 are illustrated as the same size. However, it is allowed to increase the dimension of either of them.

Moreover, in the case of this embodiment, a high refractive index portion in which the area of the above-described second plane is formed so as to be larger than the area of the first cross-section surface is the first high refractive index portion 3. In FIG. 3B, the light reflected from the first high refractive index portion 3 enters in the direction vertical to the photoelectric conversion element 2 by the tilt angle θ4 in the shape of the first high refractive index portion 3. Therefore, the condensing efficiency is improved. However, it is also allowed that the second high refractive index portion 8 has the shape.

Second Embodiment

Figure 4:
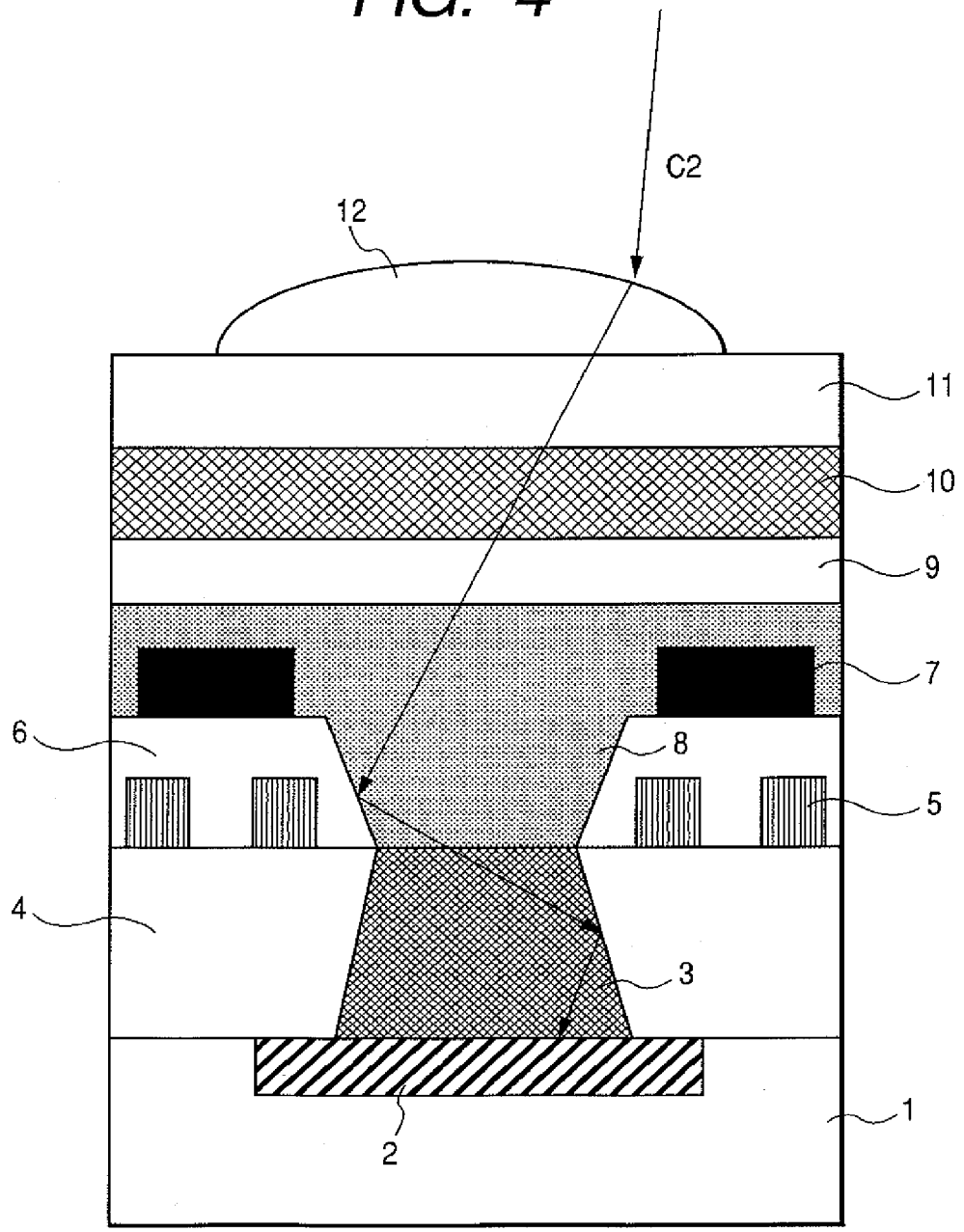
FIG. 4 is a sectional view of a photoelectric conversion device of second embodiment.

FIG. 4 shows the photoelectric conversion device of this embodiment. A member having the same function as the photoelectric conversion device of the above-described first embodiment is provided with the same symbol and its description is omitted.

In this embodiment, the first cross-section surface of the second high refractive index portion 8 is larger than the second plane of the area 8, is therefore tapered. Thereby, it is possible to increase the light entering an optical waveguide and improve the condensing efficiency of a photoelectric conversion device.

In this case, "plane" is described below by referring to FIGS. 5A and 5B similarly to the case of the first embodiment.

Figure 5A:
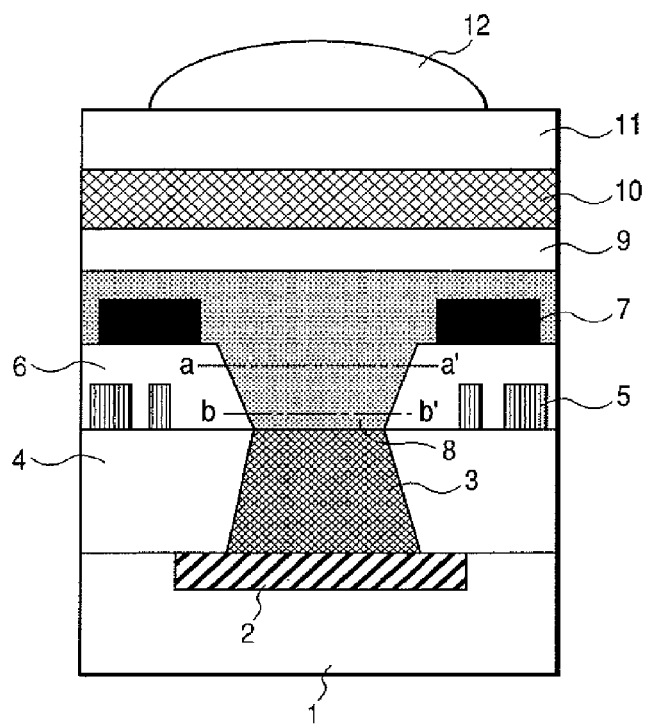
FIG. 5A is a sectional view of a photoelectric conversion device of second embodiment.
Figure 5B:
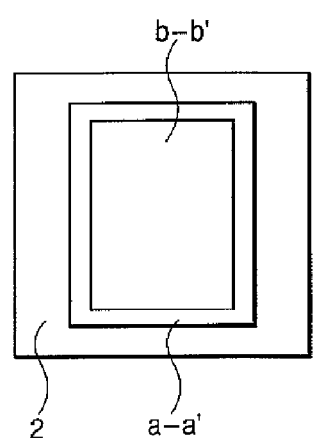
FIG. 5B is a sectional projection view of an optical waveguide of the photoelectric conversion device of the second embodiment.

FIG. 5B is an illustration showing the plane of the second high refractive index portion 8 at the line a-a' and b-b' in FIG. 5A by projecting it from the upper portion. In this case, symbol 2 in FIG. 5B shows the surface shape of the photoelectric conversion element 2 in FIG. 5A.

In this case, the plane at the line a-a' is the first cross-section surface of the second high refractive index portion 8. The plane at the line b-b' is the second plane formed at a position closer to the photoelectric conversion element than the first cross-section surface. In the case of positions of these lines, their distances may be changed as long as the cross-section surface at the line b-b' is closer to the photoelectric conversion element than the cross-section surface at the line a-a'. As previously described, in FIG. 5B, the first cross-section surface a-a' of the second high refractive index portion 8 is larger than the second plane b-b'.

In this case, as described for the first embodiment, it is possible to reflect diagonal light depending on the shape of an optical waveguide formed by the high refractive index portion 3 and insulating layer 4. Therefore, in the case of the structure of this embodiment, the light reflected from an optical waveguide formed by the high refractive index portion 8 and insulating layer 6 is reflected to the light receiving portion of the photoelectric conversion element 2 in an optical waveguide formed by the high refractive index portion 3 and insulating layer 4 and the condensing efficiency is improved.

In the case of this embodiment, because the area of the first cross-section surface of the uppermost layer high refractive index portion 8 is larger than the area of the second plane, it is easy to take in incident light. Moreover, because the high refractive index portion 3 is formed in which the area of the second plane is larger than the area of the first cross-section surface, it is possible to efficiently take in the light reflected from the previous structure.

Moreover, in this embodiment, though two optical waveguides are used, it is allowed to improve the condensing efficiency by providing the above-describe function for an optional optical waveguide in three or more optical waveguides.

Furthermore, the versatility of design of the first pattern 5 is improved by forming the structure of this embodiment. Therefore, it is easy to prevent the structure from being formed in the first high refractive index portion 3 or second high refractive index portion 8, eclipse of light does not occur and it is possible to decrease color mixture and improve the condensing efficiency.

In FIG. 4 showing this embodiment, connective portions of the first high refractive index portion 3 and second high refractive index portion 8 are planes having an equal size. However, it is allowed to increase both areas.

Third Embodiment

In this embodiment, a fabrication method of a photoelectric conversion device having an optical waveguide is described.

A well-shape structure for forming an optical waveguide can be formed in the insulating layer by plasma etching. Specifically, an etching stop layer which is hardly be etched rather than the insulating layer (the etch stop layer is, for example, silicon nitride layer) is formed on a photoelectric conversion element to perform plasma etching up to a position immediately above the photoelectric conversion element.

In this case, the plasma etching above the photoelectric conversion element may increase the number of defects of the photoelectric conversion element and increase the dark current which is a noise component of a sensor.

It is important to improve the S/N ratio which is the ratio between a signal (S) component and a noise (N) component in order to improve the performance of a sensor. An optical waveguide has a configuration capable of improving the condensing efficiency of incident light and increasing the signal component. However, at the same time, the noise component may be increased by the plasma etching. Particularly, in the case of an amplifying-type photoelectric conversion device such as a CMOS sensor having many wiring layers, it is considered that the number of damage is increased as a well-shaped portion increases in size.

The photoelectric conversion device fabrication method of this embodiment is characterized by having a step of forming a high refractive index portion serving as an optical waveguide on a photoelectric conversion element and forming an insulating layer into which a high refractive index portion is fitted and then, forming a patterned layer. In general, a conductive layer such as wiring or light shielding layer is used for a pattern. However, it is enough that a desired pattern is used without being restricted to the above case.

In this case, the high refractive index portion is formed on a semiconductor substrate correspondingly to a photoelectric conversion element and the area and the element have a refractive index higher than that of an insulating layer constituting an optical waveguide. Specifically, they are formed of silicon nitride or oxynitriding silicon.

Thus, by previously forming a high refractive index portion on a photoelectric conversion element, it is not necessary to form well-shaped portion immediately above a photoelectric conversion element through plasma etching. That is, it is possible to reduce the increase of dark current serving as a noise signal and improve the sensitivity by an optical waveguide. Even if a well-shaped portion is formed on the optical waveguide, it is possible to decrease the damage by the plasma etching on a photoelectric conversion element.

In this case, it is preferable that the high refractive index portion has a thickness between 200 and 2,000 nm in the film thickness direction, preferably has a thickness of 500 nm or more. As shown in FIG. 6, it is possible to decrease the damage on a photoelectric conversion element by virtue of the high refractive index portion when there is an etching step after forming the high refractive index portion.

Moreover, it is allowed that the high refractive index portion also has a function of an etching stop layer.

Furthermore, when using a transistor having an LDD structure for a photoelectric conversion device, it is possible to form the side wall of the transistor by using a high-refractive-index layer. A preferable thickness of the high-refractive-index layer is a thickness equal to that of a gate electrode, for example, 200 nm. From FIG. 6, it is found that it is possible to decrease the number of damage on a photoelectric conversion element in the etching step even with this thickness.

Therefore, it is possible to effectively use the function of an optical waveguide using the reflection on the interface between a high refractive index portion and an insulating layer at each thickness.

Moreover, by forming a high refractive index portion before a patterned layer, it is possible to effectively use the light receiving surface of a photoelectric conversion element and decrease the damage on the photoelectric conversion element when forming the patterned layer.

In this case, the patterned layer denotes a wiring layer or light shielding layer and is constituted of a conductive material such as aluminum or copper. However, a gate electrode made of polysilicon or the like is not included. A pattern for specifying an opening of a photoelectric conversion element is used to decide the outer periphery of a region in which light enters a photoelectric conversion element. By performing optical simulation of the cross section of the element, a pattern deciding the opening is known.

Figure 7:
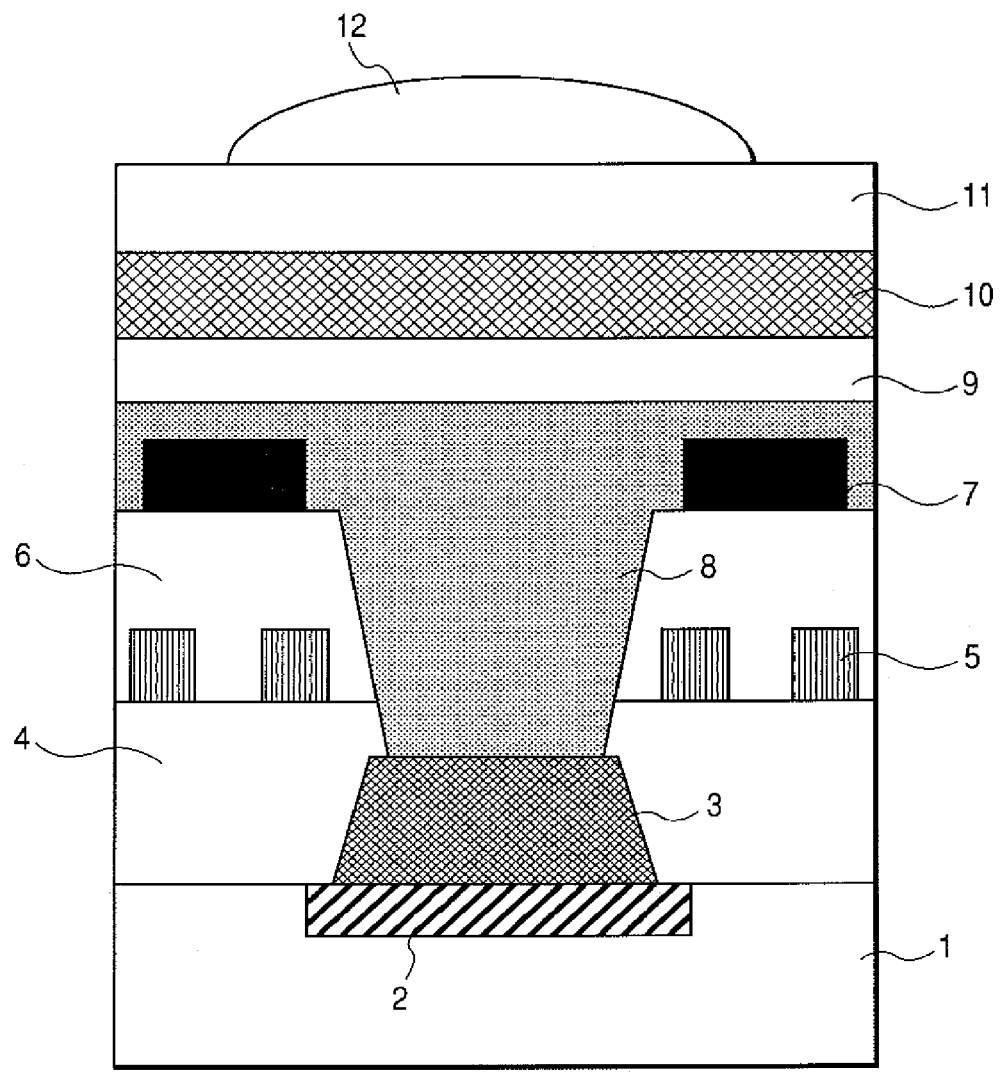
FIG. 7 is a sectional view of a photoelectric conversion device of third embodiment.

Specifically, a fabrication method is described below. FIG. 7 is a schematic sectional view vertical to a semiconductor substrate for one pixel of the previously-described CMOS-type photoelectric conversion device. In an actual photoelectric conversion device, a plurality of pixels are formed on a semiconductor substrate.

The photoelectric conversion device of this embodiment has the following configuration. In FIG. 7, the first high refractive index portion 3 and the first insulating layer 4 are formed on the semiconductor substrate 1 having the photodiode 2 serving as the photoelectric conversion element 2. There are the first pattern 5 formed on the first insulating layer 4, second insulating layer 6 covering the first pattern 5 and second pattern 7 formed on the layer 6. The second high refractive index portion 8 is formed on the first high refractive index portion 3. The planarized layer 9 formed on the high refractive index portion 8, color filter layer 10, planarized layer 11 and on-chip microlens 12 are arranged in order.

The first high refractive index portion 3 is made of a transparent material passing light and has a refractive index higher than that of the first insulating layer 4 present around the area. Specifically, it is preferable to use silicon nitride as the material of the high refractive index portion 3.

This embodiment has a configuration in which the area of the second plane at the photoelectric conversion element-2 side is larger than the area of the first cross-section surface on which the first high refractive index portion 3 is present. That is, the high refractive index portion is formed like a tapered shape. This shape can decrease leak of light. Moreover, according to a conventional fabrication method, it is difficult to use a step of etching an insulating layer on this shape and a step of embedding an optical refractive index material. However, it is possible to easily form this shape by the fabrication method of this embodiment. Of course, it is allowed that the interface between the first high refractive index portion 3 and the insulating layer 4 is vertical to the light receiving surface of the photoelectric conversion element 2.

To form a tapered shape in which the area of the second plane of the first high refractive index portion 3 is larger than the area of the first cross-section surface, there is a control of conditions in dry etching. For example, anisotropic etching is performed by a plasma etching apparatus by using gas such as $CF_4$, $CHF_3$, $CH_2F_2$, CO, $O_2$ or Ar. In this case, it is possible to realize a tapered shape by controlling various parameters such as gas flow rate, pressure, temperature, power and inter-electrode distance.

The first insulating layer 4 covers the photoelectric conversion element 2 and first high refractive index portion 3. It is preferable to use an insulator having a refractive index lower than that of the first high refractive index portion 3. Specifically, silicon oxide or silicon oxide doped with phosphor, boron or fluorine is used. It is allowed to set, for example, a gate insulating layer and gate electrode between the semiconductor substrate 1 and the first insulating layer 4 (not illustrated).

The first pattern 5 thereafter formed on the first insulating layer 4 is a wiring layer constituted of a conductive material such as aluminum or copper.

It is enough that the second insulating layer 6 has a refractive index lower than that of the first high refractive index portion 3. Specifically, it is preferable to use silicon oxide.

The second pattern 7 is constituted of a conductive material such as aluminum or copper, which may be formed as a light-shielding film for light-shielding incident light incoming to the photoelectric conversion element 2 in addition to the function of the wiring.

The second high refractive index portion 8 is formed on the photoelectric conversion element 2 between the second patterns 7 by contacting with the first high refractive index portion 3. The second high refractive index portion 8 is made of a transparent material through which light passes and a material having a refractive index higher than that of the first insulating layer 4 and second insulating layer 6. Specifically, it is preferable to use silicon nitride.

It is allowed that the second high refractive index portion 8 also serves as a passivation layer for covering the second pattern 7. Moreover, in this embodiment, the second high refractive index portion 8 is formed into a shape in which the sectional area of the first cross-section surface is larger than the sectional area of the second plane. However, it is allowed that the interface between the second high refractive index portion 8 and the insulating layer 6 is vertical to the light receiving surface of the photoelectric conversion element 2.

The planarized layer 9 is formed above the second high refractive index portion 8 according to necessity. The color filter layer 10 is formed above the planarized layer 9 according to necessity to form three colors of red, green and blue into Beyer arrangement. Moreover, the planarized layer 11 is formed above the color filter layer 10 according to necessity.

Finally, the on-chip microlens 12 is formed above the planarized layer 11 to play a role for effectively taking in light to the above high refractive index portion.

Figure 8A:
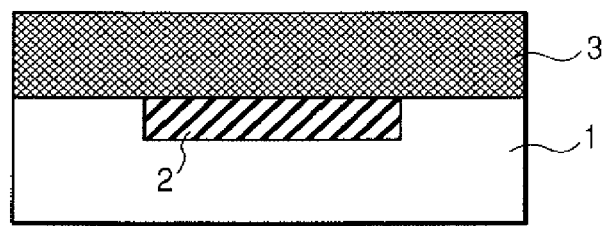
FIG. 8A is a fabrication flow of the third embodiment.
Figure 8B:
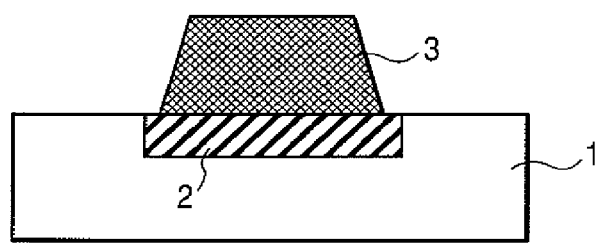
FIG. 8B is a fabrication flow of the third embodiment.
Figure 8C:
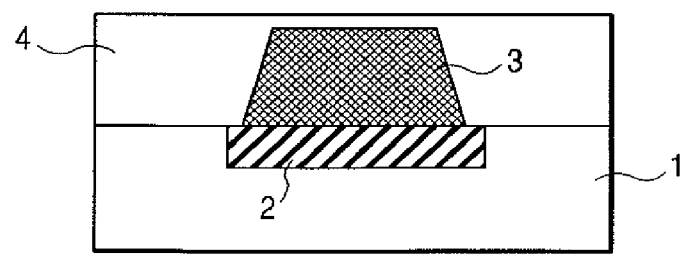
FIG. 8C is a fabrication flow of the third embodiment.

FIGS. 8A, 8B and 8C show a fabrication flow for forming the first high refractive index portion 3. First, a high refractive index material is formed like a layer on the semiconductor substrate 1 on which the photoelectric conversion element 2 is formed. It is preferable to use silicon nitride (refractive index n=2.0) obtained by using LPCVD or silicon nitride (n=2.0) obtained by using plasma CVD. In this case, it is allowed to form a gate insulating layer and gate electrode before forming the first high refractive index portion 3.

Thereafter, the first high refractive index portion 3 is formed in a desired area by using a general semiconductor working technique. It is preferable that the thickness of the high refractive index portion 3 is 500 nm or more as previously described. Moreover, it is preferable that the upper limit of the thickness is equivalent to the bottom of the first pattern 5. Specifically, the upper limit is approx. 2,000 nm. This is because the first pattern 5 is easily formed.

Thus, by previously forming the high refractive index portion 3, it is possible to decrease the number of damage on a photoelectric conversion element compared to the case of a conventional fabrication method. Moreover, it is possible to decrease the number of damage on a photodiode due to etching when forming the high refractive index portion 8.

In this case, it is preferable that the area of a plane facing the light receiving surface of the photoelectric conversion element 2, that is, the area of the plane at the lowest portion of the first high refractive index portion 3 is smaller than the surface area of the photoelectric conversion element 2. This is because leak of light to a portion other than the photoelectric conversion element 2 is decreased and particularly, this is effective when considering a shift during fabrication.

Moreover, when forming the LDD structure of a transistor, it is preferable that the first high refractive index portion 3 has a thickness equal to that of a gate electrode in the film thickness direction, for example, approx. 200 nm. By using this thickness, it is possible to form the side wall of the LDD structure and the first high refractive index portion 3 at the same time and decrease the number of man hours in addition to reduction of the number of damage on the photoelectric conversion element 2. Because the same high refractive index layer is used even when performing etchings in separate steps, it is possible to decrease the number of man hours. Moreover, as shown in FIG. 6, it is possible to decrease the damage on a photoelectric conversion element in the etching step even with this thickness.

In the case of any structure, it is possible to effectively use the function of an optical waveguide using the reflection on the interface between a high refractive index portion and an insulating layer at each thickness.

Furthermore, in the case of a general process for first forming an etching stop layer among layers formed on a photoelectric conversion element, an etching stop layer is left on an optical waveguide and a photoelectric conversion element. Therefore, the function of the optical waveguide may be damaged. Moreover, it is considered to further apply etching to a portion corresponding to the optical waveguide of the etching stop layer. However, the photoelectric conversion element is damaged by the etching step.

However, according to this embodiment, a high refractive index layer for constituting an optical waveguide is first formed among layers formed on a photoelectric conversion element. Therefore, it is possible to constitute an optical waveguide while decreasing the damage on the photoelectric conversion element due to etching.

Moreover, as shown in FIG. 8C, the first insulating layer 4 is formed by covering the first high refractive index portion 3. It is preferable to use a BPSG film obtained by doping silicon oxide with phosphor and boron for the first insulating layer 4. After forming the first insulating layer 4, planarization such as CMP is performed according to necessity.

FIG. 8C shows a configuration for completely covering the upper portion of the first high refractive index portion 3 with the first insulating layer 4. This is because planarization is improved by forming the insulating layer 4 on the whole surface when performing CMP. It is a matter of course to use a configuration in which the upper portion of the high refractive index portion 3 is peeled by performing planarization such as CMP after forming the first insulating layer 4.

Figure 9D:
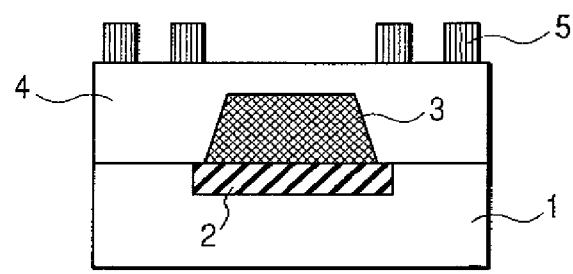
FIG. 9D is a fabrication flow of the third embodiment.
Figure 9E:
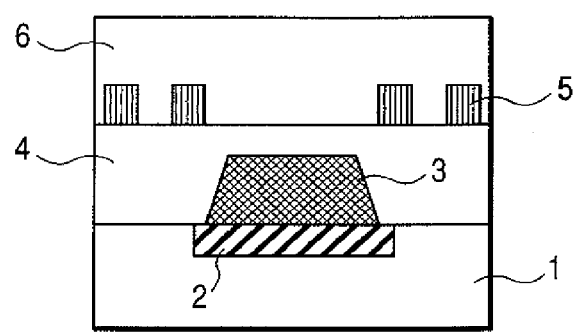
FIG. 9E is a fabrication flow of the third embodiment.
Figure 9F:
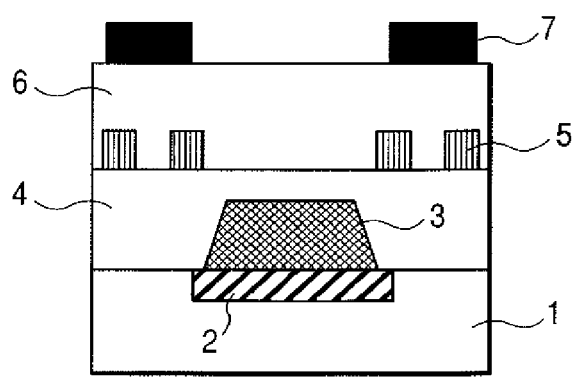
FIG. 9F is a fabrication flow of the third embodiment.

FIGS. 9D, 9E and 9F are illustrations showing a fabrication flow until the second high refractive index portion 8 is formed after forming the first high refractive index portion 3.

After forming the insulating layer 4, the first pattern 5 is formed. It is preferable to use aluminum as the material of the first pattern 5. Moreover, it is allowed to use a copper pattern formed in accordance with Damascene process. The same is also applied to the following embodiment.

According to the sequence of steps of this embodiment, because the first high refractive index portion 3 is previously formed, it is possible to form an optical waveguide by effectively using the area of the light receiving surface of the photoelectric conversion element 2. The design versatility of a high refractive index portion is improved and it is possible to make the sectional area of the high refractive index portion the maximum area for the surface area of photoelectric conversion element. This becomes particularly effective when a pixel is miniaturized and the aspect ratio of a high refractive index portion rises.

Moreover, according to this step sequence, it is possible to protect a photoelectric conversion element from the damage due to etching at the time of patterning when a patterned layer is formed on a photoelectric conversion element.

Thereafter, the second insulating layer 6 and second pattern 7 are formed. As materials, the insulating layer 6 uses plasma silicon oxide and the pattern 7 uses aluminum.

Figure 10G:
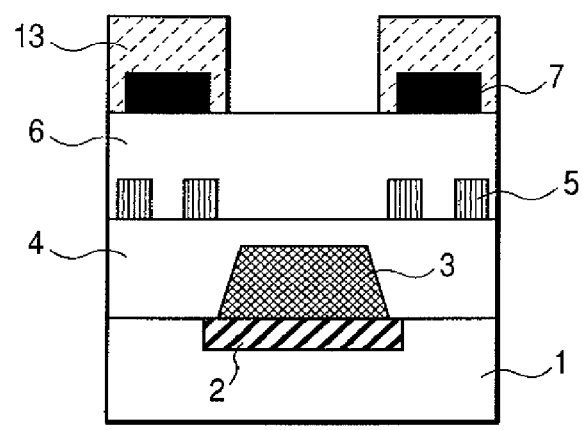
FIG. 10G is a fabrication flow of the third embodiment.
Figure 10H:
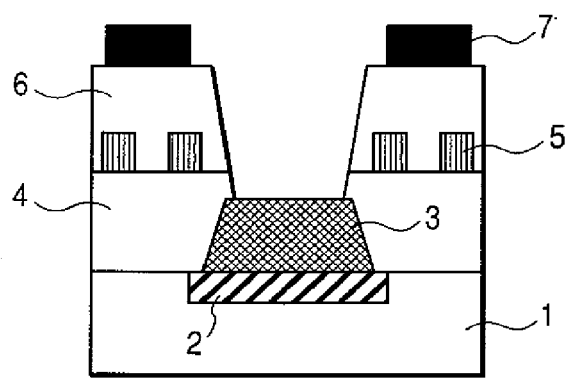
FIG. 10H is a fabrication flow of the third embodiment.
Figure 10I:
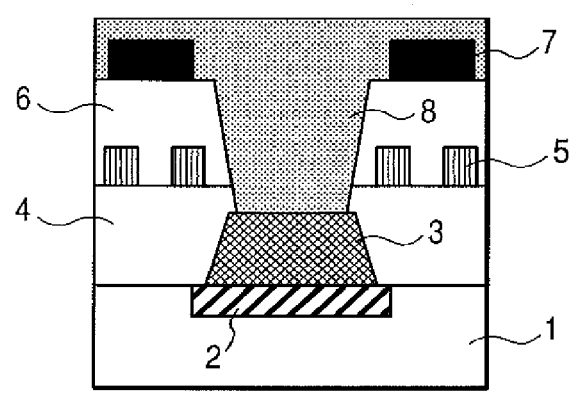
FIG. 10I is a fabrication flow of the third embodiment.

FIGS. 10G, 10H and 10I are illustrations showing a fabrication flow for forming the second high refractive index portion 8.

After forming the second pattern 7, photoresist is formed and a photoresist pattern 13 for forming the second high refractive index portion 8 is formed by using the patterning technique. Then, the second insulating layer 6 and the first insulating layer 4 are etched through plasma etching.

When the second insulating film 6 is plasma silicon oxide and the first insulating layer 4 is BPSG, plasma etching is performed by using CF gas represented by $C_4F_8$ or $C_5F_8$ and $O_2$ or Ar. In this case, by selecting an etching condition that, rather than the first high refractive index portion 3, the second insulating film 6 and the first insulating layer 4 are easily etched, it is possible to decrease the shaved quantity of the first high refractive index portion 3. Moreover, by selecting an etching condition, it is possible to perform etching like the tapered shape shown in FIG. 10H. However, it is not always necessary to use the tapered shape.

Thereafter, by embedding a high-refractive-index material, the second high refractive index portion 8 is formed. For example, silicon nitride by high-density plasma CVD or high-refractive-index material by spin coat is embedded.

After embedding the high-refractive-index material, it is allowed to planarize the upper portion by using resist etch back or CMP according to necessity.

In this case, it is preferable that the first high refractive index portion 3 and the second high refractive index portion 8 are made of materials having the same refractive index. This is because the reflection on the interface at their connective portion can be decreased. However, it is not necessary that they are the same. In this case, it is also allowed to form an antireflection film for decreasing the reflection on the interface on the interface.

In this embodiment, the second high refractive index portion 8 is formed by forming a well-shaped portion by etching. However, it is allowed to previously pattern and form the second high refractive index portion 8 similarly to the case of the first high refractive index portion 3.

As described above, according to a fabrication method of the present invention, it is possible to decrease the number of damage due to plasma etching when forming an optical waveguide immediately above a photoelectric conversion element. Therefore, it is possible to reduce the increase of the dark current which is the noise component of a sensor.

Moreover, the same advantage is obtained from not only a high refractive index portion in which a plurality of optical waveguides are present but also a configuration constituted of one area.

Fourth Embodiment

Figure 11:
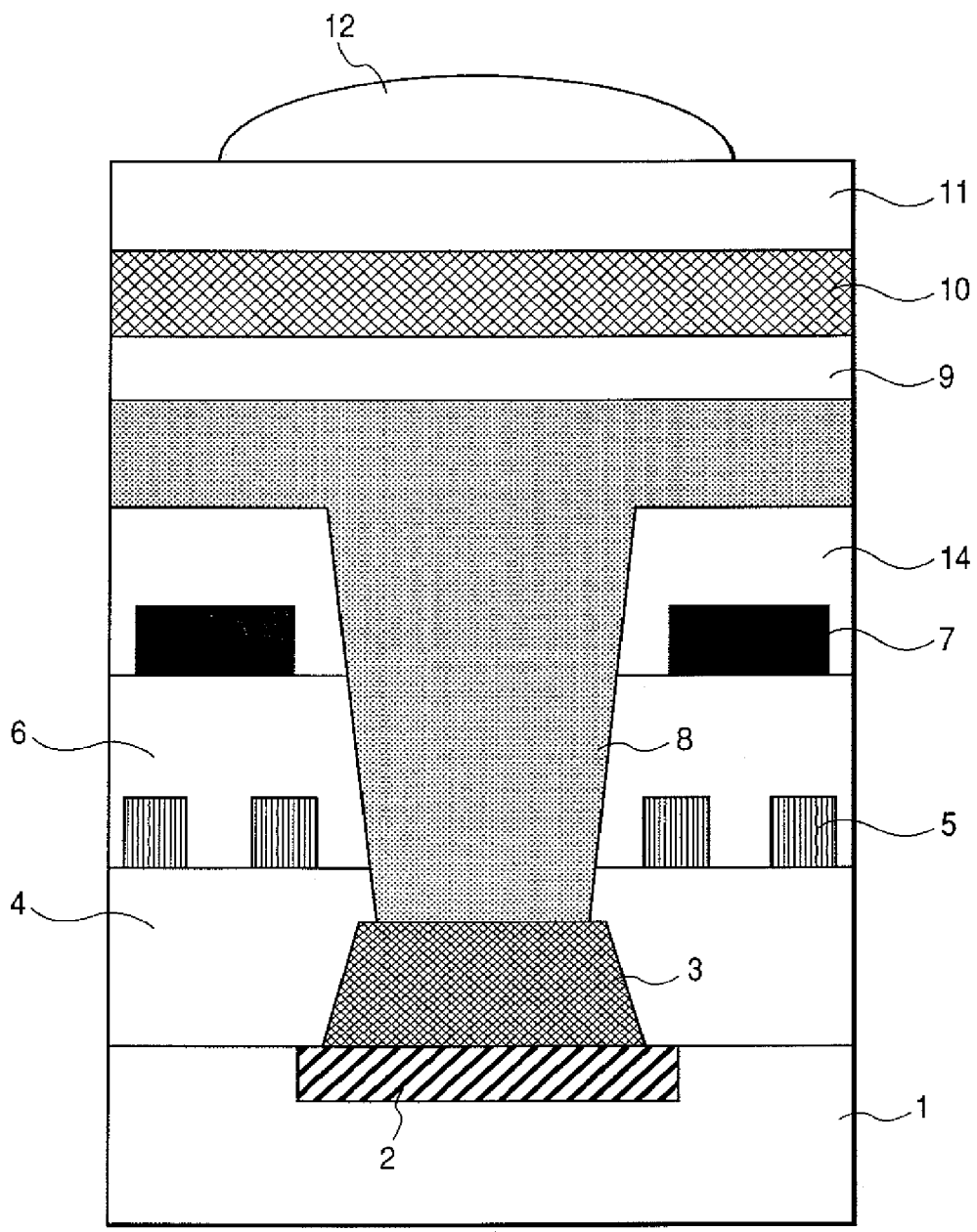
FIG. 11 is a sectional view of a photoelectric conversion device of fourth embodiment.

FIG. 11 shows a photoelectric conversion device of fourth embodiment. A member same as that of the above-described third embodiment is provided with the same symbol and its description is omitted. Moreover, the description on the same fabrication method is omitted.

The photoelectric conversion device of the fourth embodiment forms a third insulating layer 14 after forming the second pattern 7 to planarize CMP or the like. Thereafter, the photoelectric conversion device performs well-shaped portion to form the second high refractive index portion 8. By planarizing the third insulating layer 14, it is possible to stably perform the exposure in the etching step for forming the second high refractive index portion 8.

In the case of this embodiment, by first forming the first high refractive index portion 3 closest to the photoelectric conversion device 2, it is possible to reduce the increase of the noise component due to the damage by plasma etching. At the same time, by performing well-shaped portion after planarizing an insulating layer, it is possible to accurately perform the etching for making well-shaped portion and the condensing efficiency is improved.

Fifth Embodiment

Figure 12:
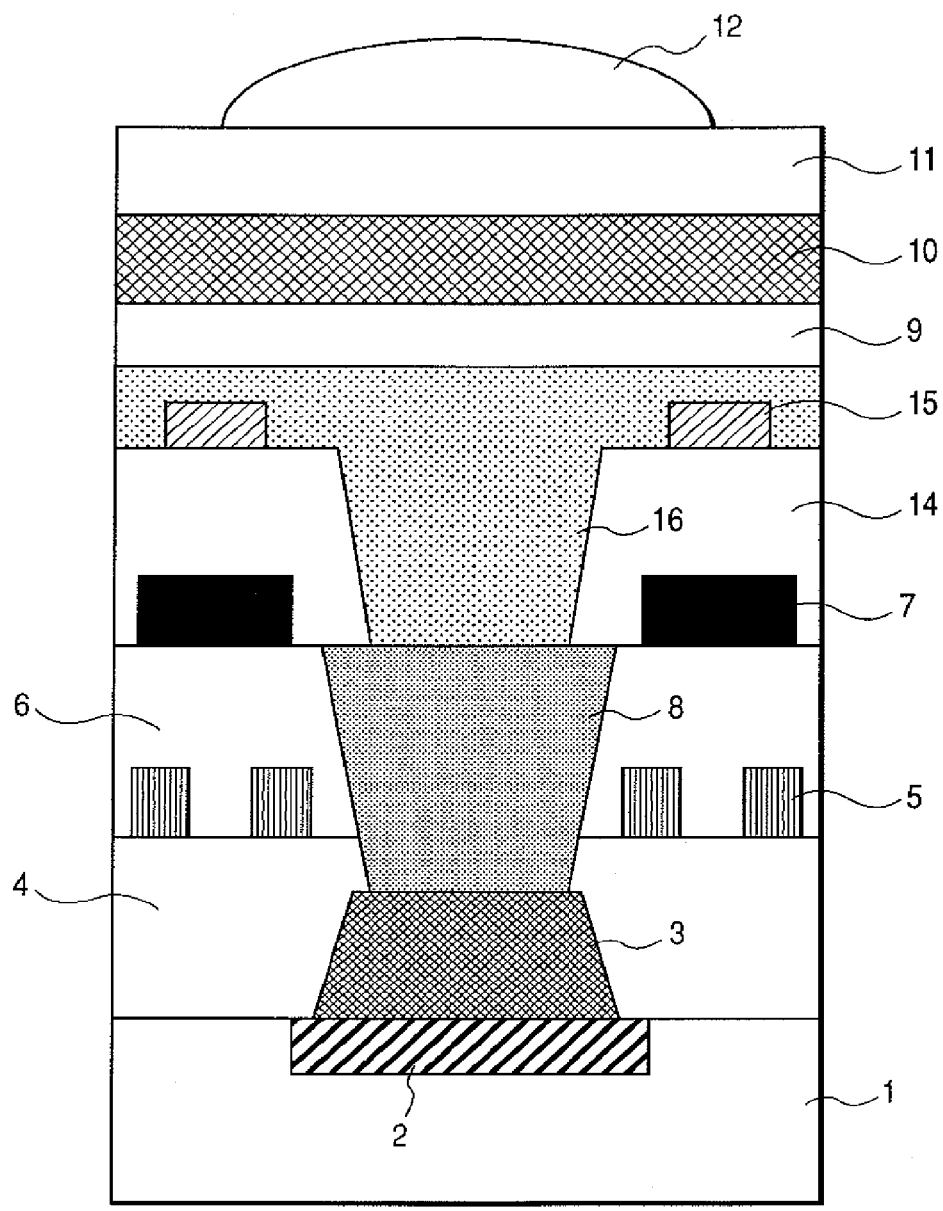
FIG. 12 is a sectional view of a photoelectric conversion device of fifth embodiment.

FIG. 12 shows the photoelectric conversion device of this embodiment. A third high refractive index portion 16 is formed in addition to the second high refractive index portion 8. Moreover, symbol 14 denotes a third insulating layer and 15 denotes a third wiring layer.

Furthermore, a member same as that of the first embodiment is provided with the same symbol and its description is omitted and the description on the same fabrication method is also omitted.

When forming an optical waveguide having a high aspect ratio for multilayer wiring, the aspect ratio for each layer is decreased by increasing the number of layers and a high-refractive-index material is easily embedded.

In the case of this embodiment, it is possible to reduce the increase of the number of noise components due to plasma damage by previously forming the first high refractive index portion 3 present at a position closest to the photoelectric conversion device 2 similarly to the case of the first embodiment. Particularly, this is effective because a plurality of optical waveguides are formed. At the same time, by using three layers of high refractive index portions, it is possible to obtain a preferable embedding property also when forming an optical waveguide having a high aspect ratio by change of wiring layers to multilayer.

The shape of an optical waveguide is not restricted. Moreover, though a plurality of high refractive index portions are formed for each embodiment, the advantage of even one area can be obtained according to a fabrication method of the present invention.

Application to Image-Pickup Module

Figure 13:
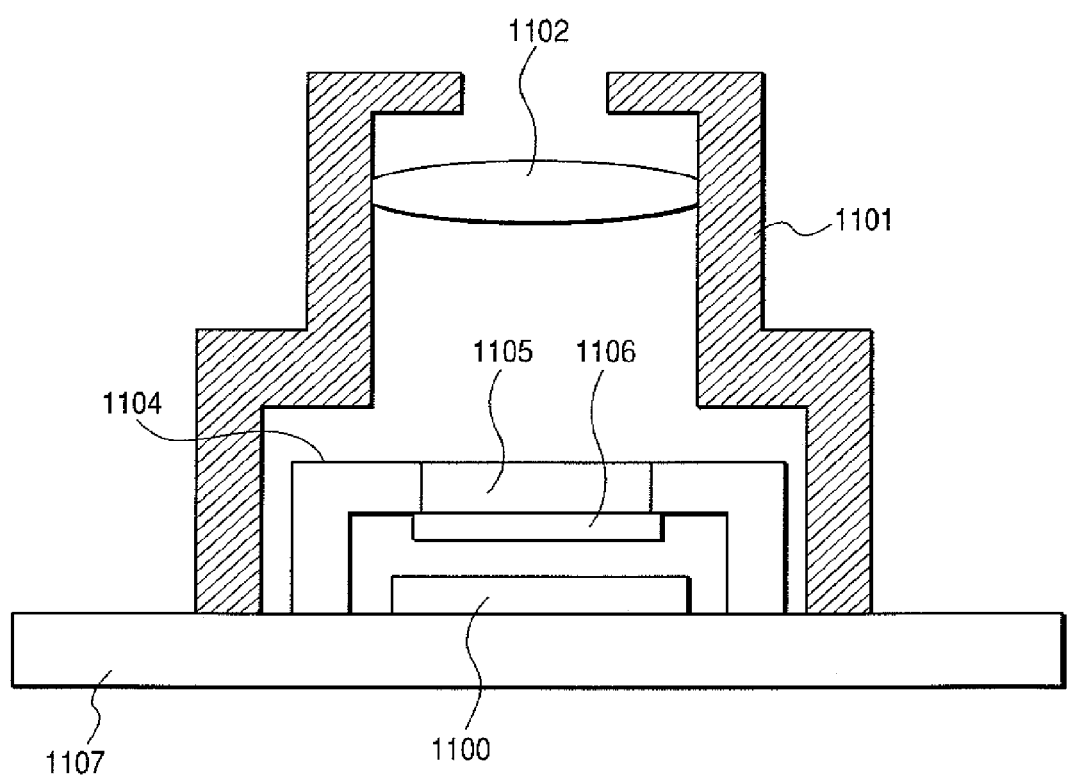
FIG. 13 is a block diagram of an image pickup module to which a photoelectric conversion device of the present invention is applied.

FIG. 13 is a block diagram showing a case of applying a photoelectric conversion device fabricated by the fabrication method of a photoelectric conversion device described in the first to fifth embodiments of the present invention to an image pickup module used for a portable unit.

There is a cover portion member 1104 for setting a photoelectric conversion device 1100 on a substrate 1107 made of ceramic or the like and sealing the device 1100. The substrate 1107 is electrically connected with the photoelectric conversion device 1100. An optical portion 1105 for taking in light and optical low-pass filter 1106 are set on the photoelectric conversion device 1100. Moreover, an image pickup lens 1102 and a lens-barrel member 1101 for fixing the lens 1102, which cover the covering member 1104, are well sealed together with the substrate 1107.

In the case of this application, it is allowed that not only a photoelectric conversion device of the present invention but also an image-pickup-signal processing circuit, A/D converter (analog/digital converter) and module control portion are mounted on the substrate 1107. Moreover, it is allowed that they are mounted on the same semiconductor substrate (1 in FIG. 1) with the photoelectric conversion device in accordance with the same step.

Application to Digital Camera

Figure 14:
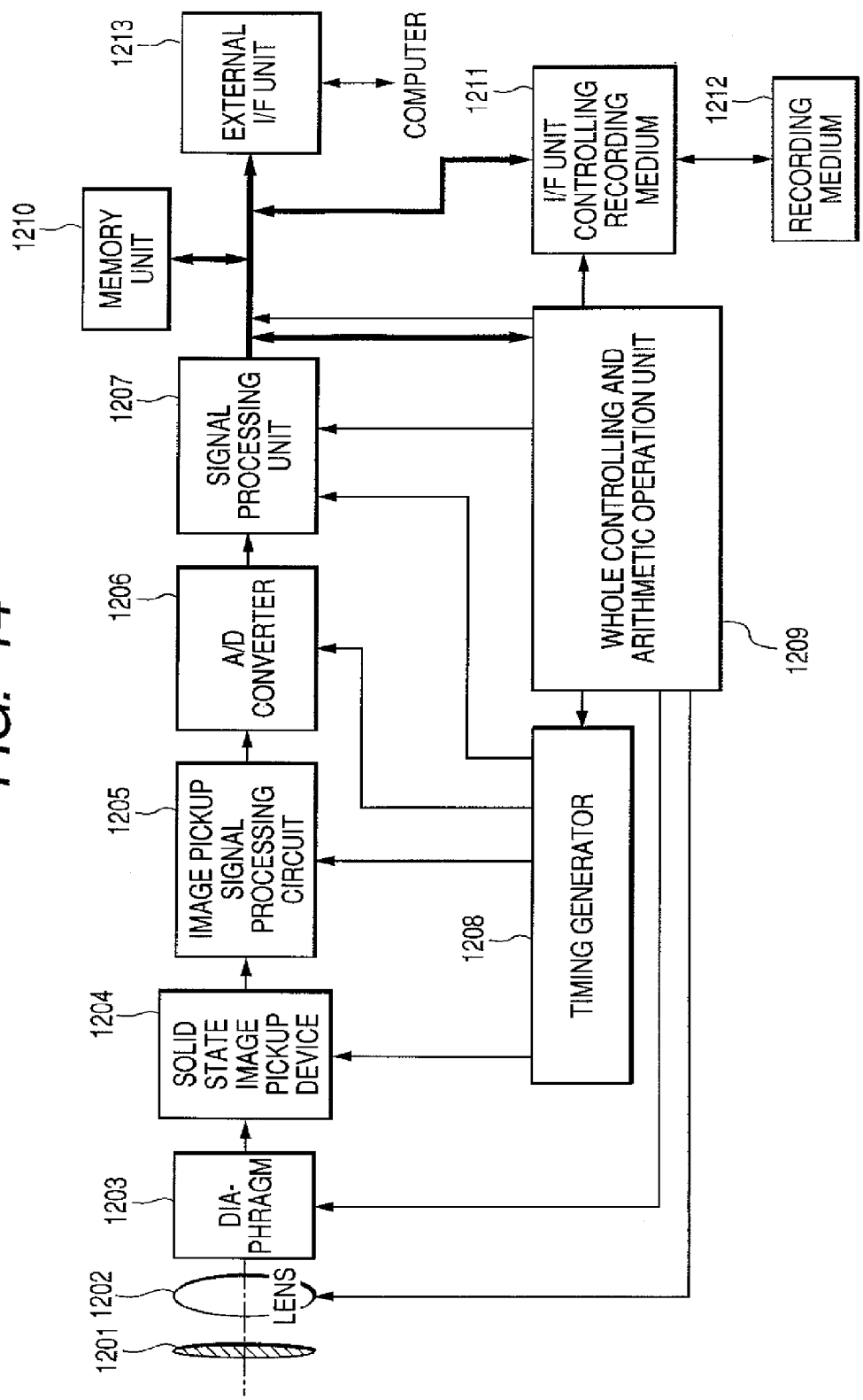
FIG. 14 is a block diagram showing a configuration of a digital camera serving as an image pickup system.

FIG. 14 is a block diagram when applying a photoelectric conversion device fabricated by the photoelectric conversion-device fabrication method described in the first to fifth embodiments of the present invention to a digital camera serving as an image pickup system.

As an optical configuration for taking in light to a photoelectric conversion device 1204, there are a shutter 1201, image pickup lens 1202 and aperture 1203. The shutter 1201 controls the exposure to a photoelectric conversion device 1204 and incident light is imaged on the photoelectric conversion device 1204 by the image pickup lens 1202. In this case, light quantity is controlled by the aperture 1203.

A signal output from the photoelectric conversion device 1204 in accordance with taken-in light is processed by a signal processing circuit 1205 and converted from an analog signal to a digital signal by an A/D converter 1206. The output digital signal is computed by a signal processing portion 1207 and image pickup data is generated. The image pickup data can be accumulated in a memory 1210 mounted on a digital camera or transmitted to an external unit such as a computer or printer through an external I/F portion 1213 in accordance with operation modes set by a user. Moreover, it is possible to record the image pickup data in a recording medium 1212 which can be set to or removed from a digital camera through a recording-medium control I/F portion 1211.

The photoelectric conversion device 1204, signal processing circuit 1205, A/D converter 1206 and signal processing portion 1207 are controlled by a timing generating portion 1208 and the whole system is controlled by a general-control and computing portion 1209. It is possible that these systems are formed on the same semiconductor substrate (1 in FIG. 1) as the photoelectric conversion device 1204 in the same step.

This application claims priority from Japanese Patent Application Nos. 2005-280108 filed on Sep. 27, 2005 and 2005-280109 filed on Sep. 27, 2005, which are hereby incorporated by reference herein.

The invention claimed is:

1. A method of fabricating a photoelectric conversion device, comprising the steps of:
    forming on a substrate a film covering a photoelectric conversion element and a gate electrode of a transistor;
    forming a first portion on at least a part of a light receiving surface of the photoelectric conversion element, and a side wall on the gate electrode for a lightly doped drain (LDD) structure of the transistor, wherein the first portion and the side wall are formed from the film by etching the film;
    forming on the substrate a first insulating layer that covers the first portion;
    forming a copper pattern on the substrate after forming the first insulating layer;
    forming on the substrate a second insulating layer that covers the first portion and the copper pattern;
    forming a well-shaped portion by etching the second and first insulating layers, said first portion being positioned between the light receiving surface and the well-shaped portion in a direction vertical to the light receiving surface;
    forming a second portion by embedding a transparent material in the well-shaped portion, said first portion being positioned between the light receiving surface and the second portion in the direction vertical to the light receiving surface, and said first and second insulating layers being present around the second portion in a direction horizontal to the light receiving surface.

2. The method according to claim 1, comprising forming a plurality of first portions corresponding to a plurality of the photoelectric conversion elements.

3. The method according to claim 1, wherein a refractive index of the second portion is different from a refractive index of the first portion, and a film is positioned between the first portion and the second portion.

4. The method according to claim 1, wherein the second portion is formed in contact with the first portion.

5. The method according to claim 1, wherein a distance from the light receiving surface to a bottom of the well-shaped portion is 200 nm to 2000 nm.

6. The method according to claim 1, further comprising planarizing the first insulating layer.

7. The method according to claim 1, further comprising forming a conductive pattern on the substrate after forming the second insulating layer and before forming the well-shaped portion.

8. The method according to claim 1, wherein the first insulating layer is formed around the first portion in a first plane and a second plane, the first and second planes being along the direction horizontal to the light receiving surface, and the second plane being between the first plane and the light receiving surface, a cross-sectional area of the first portion in the first plane being smaller than a cross-sectional area of the first portion in the second plane.

9. The method according to claim 1, wherein the second insulating layer is formed around the second portion in a third plane and a fourth plane, the third and fourth planes being along the direction horizontal to the light receiving surface, and the fourth plane being between the third plane and the light receiving surface, a cross-sectional area of the second portion in the third plane being larger than a cross-sectional area of the second portion in the fourth plane.

10. The method according to claim 1, wherein the second portion is formed in contact with the first portion and the cross-sectional area of the second portion in the third plane is larger than a contact area between the first portion and the second portion.

11. The method according to claim 1, wherein the first portion comprises silicon nitride or oxynitrided silicon.

12. The method according to claim 1, wherein the transparent material comprises silicon nitride.

13. The method according to claim 1, wherein the first portion and the second portion comprises silicon nitride.

14. The method according to claim 1, wherein the etching of the first and second insulating layers is performed by plasma etching.

15. The method according to claim 1, wherein the transparent material is embedded by high-density plasma CVD or spin coat.

16. The method according to claim 1, wherein the first insulating layer comprises silicon oxide or silicon oxide doped with at least one of phosphorus, boron or fluorine.

17. The method according to claim 1, further comprising forming a microlens above the second portion, wherein the transparent material embedded in the well-shape portion does not exist between an upper face of the second insulating layer and the microlens in the direction vertical to the light receiving surface.

18. The method according to claim 7, further comprising forming a third portion including a first part and a second part, the conductive pattern being positioned between the second insulating layer and the first part, and the second portion being positioned between the second part and the first portion, wherein a distance between the second part and the substrate is smaller than a distance between the first part and the substrate.

19. An image pickup module comprising the photoelectric conversion device fabricated by the method according to claim 1, a lens member for imaging light on the photoelectric conversion device, and a lens-barrel member for holding the lens member.

20. An image pickup system comprising the photoelectric conversion device fabricated by the method according to claim 1, and a signal processing circuit for processing a signal output from the photoelectric conversion device.

* * * * *